(12) United States Patent
Tsuruki

(10) Patent No.: US 6,768,360 B2
(45) Date of Patent: Jul. 27, 2004

(54) TIMING SIGNAL GENERATION CIRCUIT AND SEMICONDUCTOR TEST DEVICE WITH THE SAME

(75) Inventor: Yasutaka Tsuruki, Tokyo (JP)

(73) Assignee: Advantest Corp., Tokyo (JP)

( * ) Notice: Subject to any disclaimer, the term of this patent is extended or adjusted under 35 U.S.C. 154(b) by 109 days.

(21) Appl. No.: 09/948,503

(22) Filed: Sep. 6, 2001

(65) Prior Publication Data

US 2002/0027431 A1 Mar. 7, 2002

(30) Foreign Application Priority Data

Sep. 7, 2000 (JP) ........................................ 2000-271734

(51) Int. Cl.[7] .................................................. H03L 7/00
(52) U.S. Cl. ...................................... 327/158; 327/161
(58) Field of Search ................................. 327/158, 161, 327/153, 149; 375/373, 375, 376; 331/25

(56) References Cited

U.S. PATENT DOCUMENTS 5,247,229 A * 9/1993 Ngo et al. .................. 315/364
5,349,612 A * 9/1994 Guo et al. .................. 375/371
5,491,673 A  2/1996 Okayasu .................... 327/158
6,043,717 A * 3/2000 Kurd ............................ 331/17

FOREIGN PATENT DOCUMENTS

JP  5-136664  6/1993
JP  8-51346   2/1996

* cited by examiner

Primary Examiner—Linh M. Nguyen
(74) Attorney, Agent, or Firm—Muramatsu & Associates (57) ABSTRACT

A timing signal generation circuit comprising: a negative feedback loop comprising; a variable delay circuit for outputting a timing signal delayed from an input clock signal by a delay amount designated by a delay code; a phase difference detector for detecting a phase difference between the timing signal and the input clock signal to output a detection signal; and a loop filter for smoothing a waveform of the detection signal to generate a voltage signal and for feeding the voltage signal back to the variable delay circuit: and a cancel unit for generating a reverse detection signal based on the delay code to cancel the phase difference caused by a change in the delay amount where the reverse detection signal is supplied to the low pass filter.

6 Claims, 7 Drawing Sheets

TIMING SIGNAL GENERATION CIRCUIT AND SEMICONDUCTOR TEST DEVICE WITH THE SAME

BACKGROUND OF THE INVENTION

1. Field of the Invention

The present invention relates to a timing signal generation circuit arranged to generate timing signals of high resolution suitable for use in electrical devices such as an IC test system.

2. Description of the Related Art

An example of conventional timing signal generation circuits is shown in Japanese Patent Laid-open No. H5(1993)-136664.

Figure 6:
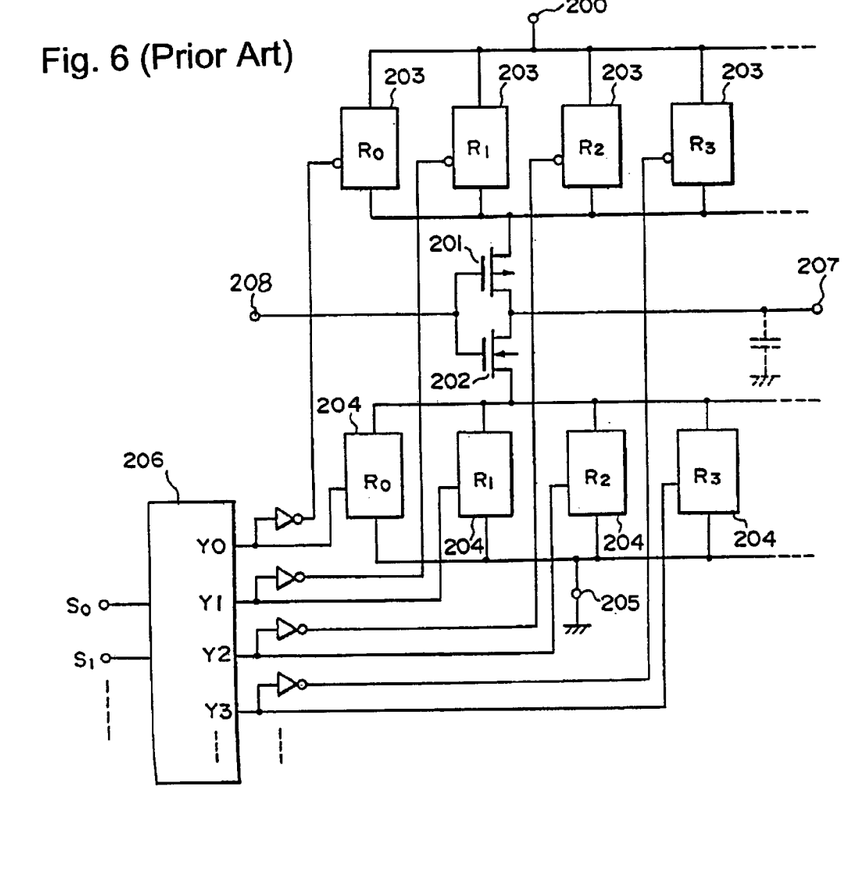
FIG. 6 is a block circuit diagram showing the structure of a first conventional timing signal generation circuit.

The timing signal generation circuit of the document will be explained with reference to FIG. 6 as a first conventional example. FIG. 6 is a circuit diagram illustrating the structure of the first conventional timing signal generation circuit.

As shown in FIG. 6, this timing signal generation circuit is provided with a CMOS constructed of a p-channel FET 201 and an n-channel FET 202. The gate of the COMS is connected to an input terminal 208, while the drain thereof is connected to an output terminal 207. The source of the FET 202 is connected to a negative power supply terminal 205 through resister elements 204 constructed of n-channel switchable FETs whose resistance is respectively $R_0$, $R_1$, $R_2$, ... and the source of the FET 201 is connected to a positive power supply terminal 205 through resister elements 203 constructed of n-channel switchable FETs whose resistance is respectively $R_0$, $R_1$, $R_2$, ...

Since a plurality of pairs of resistor elements are provided in one delay circuit, many delay amounts can be set. If this circuit is used as one stage of multistage delay circuit, a great number of delay amounts can be set with a few delay stages. Consequently, delay amounts of high resolution can be obtained with a small dispersion.

Another example of conventional timing signal generation circuits is shown in Japanese Patent Laid-open No. H8(1996)-51346 and U.S. Pat. No. 5,491,673.

Figure 7:
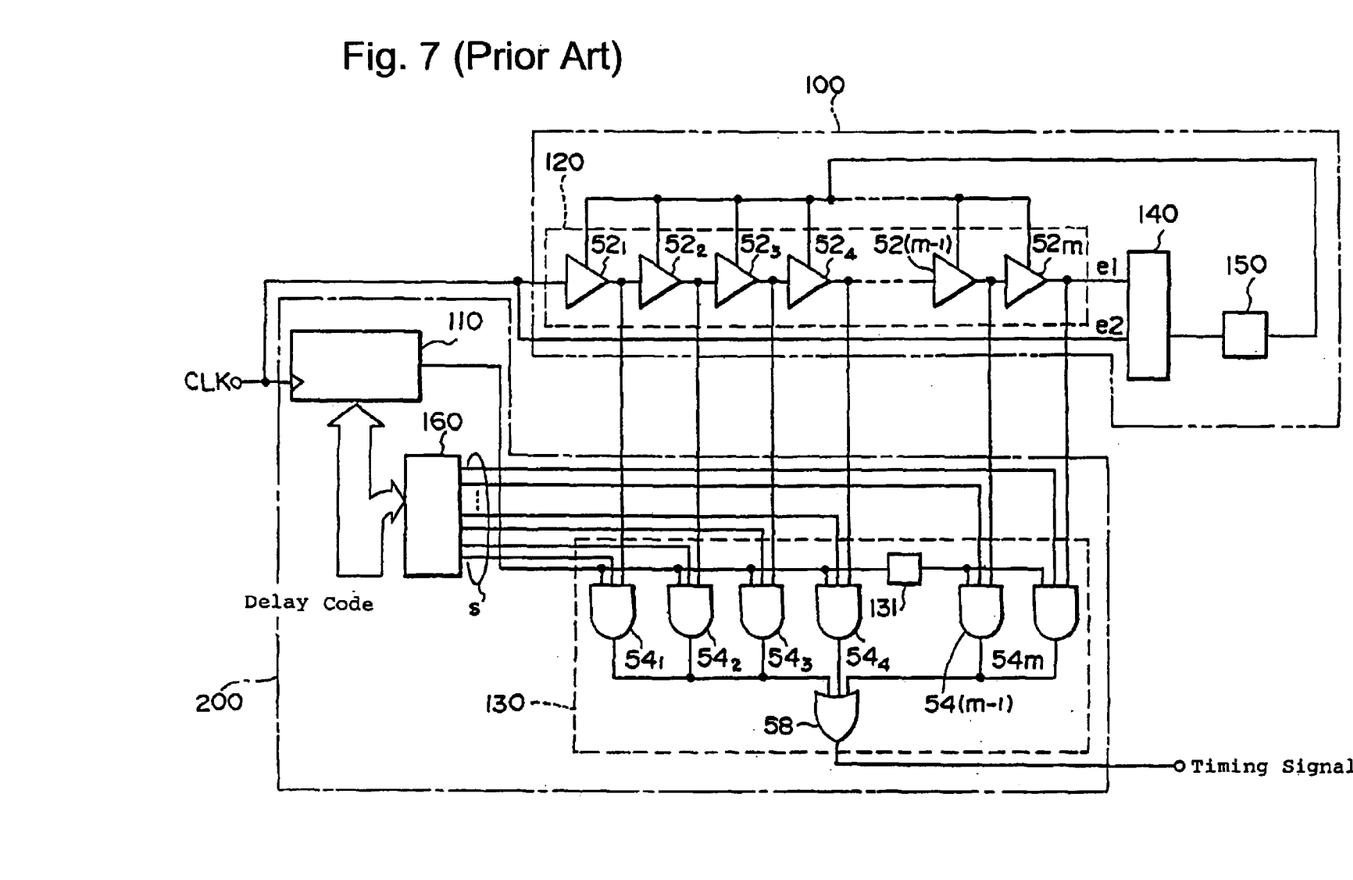
FIG. 7 is a circuit diagram showing the structure of a second conventional timing signal generation circuit.

The timing signal generation circuit of these documents will be explained with reference to FIG. 7 as a second conventional example. FIG. 7 is a circuit diagram illustrating the structure of the second conventional timing signal generation circuit.

As shown in FIG. 7, this timing signal generation circuit is constructed of a variable delay circuit 120, a phase comparator 140, a feedback circuit 150, a synchronous delay circuit 110 and a selector circuit 130.

The variable delay circuit 120 is constructed of m-stage variable delay elements $52_1$ to $52_m$ ("m" is an integer of 2 or more) which are serially connected each other. Each of the variable delay elements generates a minute delay which is 1/m of a clock period.

The phase comparator 140 compares the phase of a delay amount of all the variable delay elements or an output (e1) of the final variable delay element $52_m$ with the phase of a clock signal (e2) to produce a phase difference as a voltage signal.

The feedback circuit 150 feeds back the voltage signal supplied from the phase comparator 140 to each of the variable delay elements. This feedback allows the maintenance of a phase lock state where a delay amount of all the variable delay elements coincides with a clock period. The variable delay circuit 120, the phase comparator 140 and the feedback circuit 150 constitute a phase synchronous loop circuit unit 100.

The synchronous delay circuit 110 generates an output signal of a delay time which is an integer multiple of a clock period based on upper digitals of delay data (delay code).

The selector circuit 130 has AND gates $54_1$ to $54_m$ provided one for each of the variable delay elements $52_1$ to $52_m$. An output of a variable delay element, a selection signal "s" generated by a decoder 160 based on lower digitals of delay data (delay code), and an output of the synchronous delay circuit 110 are supplied to the corresponding AND gate. Selection signals "s" are generated corresponding to bits, respectively. An output of each AND gate $54_1$ to $54_m$ is supplied to an OR gate 58. The OR gate 58 then generates and outputs a timing signal.

The selector circuit 130 outputs a timing signal by selecting a minute delay from any one of the variable delay elements 52 of the variable delay circuit 120 on the basis of selection signals generated by the decoder 160.

In this conventional timing signal generation circuit, changes in delay amount are prevented by a negative feedback loop of the phase synchronous loop circuit unit 100, thereby preventing decreases in timing accuracy. Thus, the timing signal generation circuit can generate timing signals with high accuracy, even when an IC, e.g. composed of a CMOS, which controls the power supply voltage of the variable delay elements $52_1$ to $52_m$ and the like is adversely affected by disturbances such as changes in temperature or power supply voltage.

Further, in this timing signal generation circuit, each of the variable delay elements $52_1$ to $52_m$ of the variable delay circuit 120 always operates in synchronism with highly accurate clock signals. As a result, the amount of self-generating heat of the variable delay circuit 120 is stable without any time variation. Thus, the negative feedback loop of the phase synchronous loop circuit unit 100 is required only to respond to disturbances, not to have the high-speed response capability.

If necessary, a delay amount of a timing signal against a clock signal may be changed. In such a situation, the delay amount is required to be changed with high resolution, the delay amount is required to be changed with high resolution, e.g., as high as several picoseconds in operation of the timing signal generation circuit.

However, in the timing signal generation circuit of Japanese Patent Laid-open No. H5(1993)-136664, if a delay amount changes in operation (hereinafter referred to as "on-the-fly"), a phase difference comparator disadvantageously detects a phase change caused by this change. If a variable delay element receives, as a feedback signal, the change corresponding to the on-the-fly, which is contained in a voltage signal output from the phase difference comparator, the phase lock may be released, resulting in a timing error.

In the timing signal generation circuit of Japanese Patent Laid-open No. H8(1996)-51346 and U.S. Pat. No. 5,491,673, since a delay amount of each variable delay element 52 is at least the amount of single-stage gate, the resolution of a variable delay amount is as low as several hundreds picoseconds. In other words, high resolution, e.g., as high as several picoseconds, cannot be obtained. Thus, further technical improvement is required for the conventional timing signal generation circuits.

SUMMARY OF THE INVENTION

It is therefore an object of the present invention to provide a timing signal generation circuit where a delay amount can be changed in operation with high resolution, while maintaining a phase lock state.

According to a first aspect of the present invention, there is provided a timing signal generation circuit comprising: a negative feedback loop for maintaining a phase lock state; the negative feedback loop comprising; a variable delay circuit for outputting a timing signal delayed from an input clock signal by a delay amount designated by a delay code; a phase difference detector for detecting a phase difference between the timing signal and the input clock signal to output a detection signal; and a loop filter for smoothing a waveform of the detection signal to generate a voltage signal and for feeding the voltage signal back to the variable delay circuit: and a cancel unit for generating a reverse detection signal based on the delay code to cancel the phase difference caused by a change in the delay amount where the reverse detection signal is supplied to the low pass filter.

In this timing signal generation circuit, the cancel unit generates a reverse detection signal for canceling a detection signal due to the on-the-fly change of the delay code, while the negative feedback loop presents the occurrence of a timing error caused by disturbances and the like. As a result, in this negative feedback loop, a voltage signal due to the on-the-fly change is not fed back to the variable delay circuit. Thus, in the present invention, even if a delay amount is changed in operation, the phase lock is not released (phase lock state is maintained), thereby preventing a timing error. For this reason, the timing signal generation circuit can stably generate highly accurate timing signals.

A delay amount is designated by a delay code in operation. Thus, the cancel unit generates a reverse detection signal based on the instructions of the delay code. For example, each bit value of a delay code is preferably decoded to generate signals by bit, which signals are converted to analog signals for use.

According to a second aspect of the present invention, there is provided a semiconductor test device comprising: the timing signal generation circuit in the first aspect of the present invention for generating a timing signal: and a test pattern generator for generating a pattern signal, the pattern signal being combined with the timing signal to generate a timing waveform for test of a semiconductor integrated circuit.

In this semiconductor test device, even if a delay amount is changed in operation, the timing signal generation circuit can stably generate highly accurate timing signals, by preventing the release of the phase lock and the occurrence of a timing error. As a result, by using the timing signals in combination with pattern signals to generate timing waveforms for test, the reliability of the test can be enhanced.

DETAILED DESCRIPTION OF THE PREFERRED EMBODIMENTS

Embodiments of the present invention will be explained with reference to drawings.

[Embodiment 1]

A first embodiment of the timing signal generation circuit according to the present invention will be explained with reference to FIG. 1.

Figure 1:
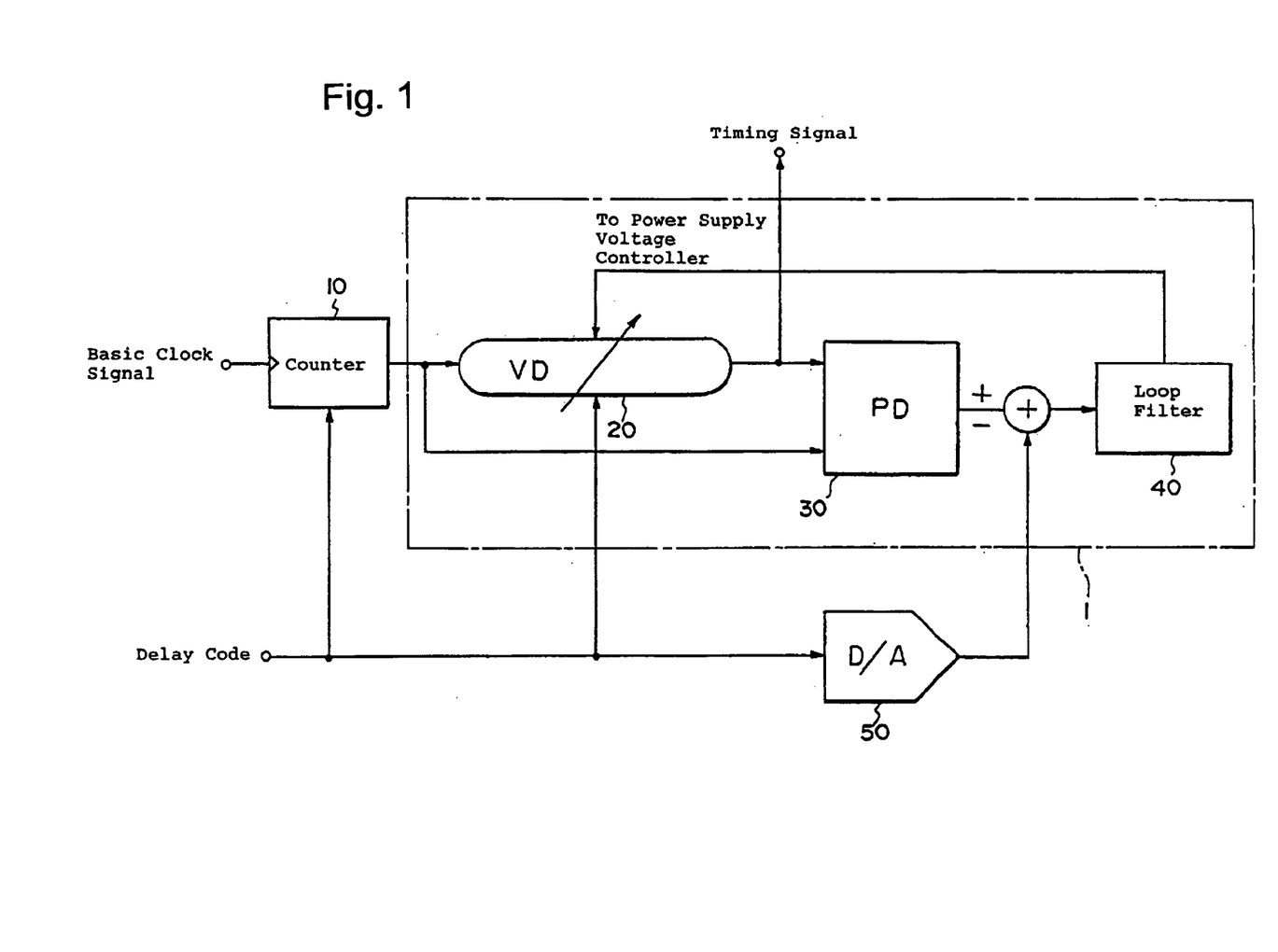
FIG. 1 is a block circuit diagram showing the structure of a timing signal generation circuit according to Embodiment 1.

FIG. 1 is a block circuit diagram showing the structure of a timing signal generation circuit according to Embodiment 1. As shown in FIG. 1, the timing signal generation circuit is constructed of a counter 10, a negative feedback loop 1 and a cancel unit 50.

The counter 10 is of construction similar to that of the conventional synchronous delay circuit 110 as stated above. The counter 10 generates input clock signals whose period is an integer multiple of that of a basic clock signal (reference clock) in response to delay codes and supplies the input clock signals to the negative feedback loop 1.

The negative feedback loop 1 is constructed of a variable delay circuit 20, a phase difference detector 30 and a loop filter 40 for maintaining a phase lock state.

The variable delay circuit 20 (shown by "VD" in FIG. 1) receives an input clock signal from the counter 10. The variable delay circuit 20 then outputs a timing signal delayed from the input clock signal by a delay amount designated by a delay code. The variable delay circuit 20 is of construction similar to that of the first conventional variable delay circuit as shown in FIG. 6.

The phase difference detector 30 (shown by "PD" in FIG. 1) is of construction similar to that of the conventional phase comparator 140 stated above. The phase difference detector 30 receives an input signal from the counter 10, and a timing signal from the variable delay circuit 20. The phase difference detector 30 then detects a phase difference between the timing signal and the input clock signal and outputs a detection signal which represents the detection result as a voltage waveform. The voltage waveform is a waveform of phase differences in the time chart of FIG. 3.

The loop filter 40 is of construction similar to that of the conventional feedback circuit 150 stated above. The loop filter 40 smoothes the waveform of a detection signal output from the phase difference detector 30 to produce a voltage signal. In this smoothing, the frequency characteristic of the negative feedback loop 1 depends on that of the type of filter used such as a low pass filter (not shown).

The voltage signal is applied to a power supply voltage controller of the variable delay circuit 20. In this embodiment, for example, each variable delay element of the variable delay circuit 20, which generates a delay, is constructed of a CMOS device (FIG. 7), like the conventional examples stated above. A delay amount of each variable delay element can be controlled by controlling a voltage applied to the CMOS like the conventional examples.

In the timing signal generation circuit of the embodiment, the cancel unit 50 is constructed of a D/A converter, which generates a reverse detection signal based on a delay code. Any suitable D/A converters can be used as the D/A converter 50.

Figure 2:
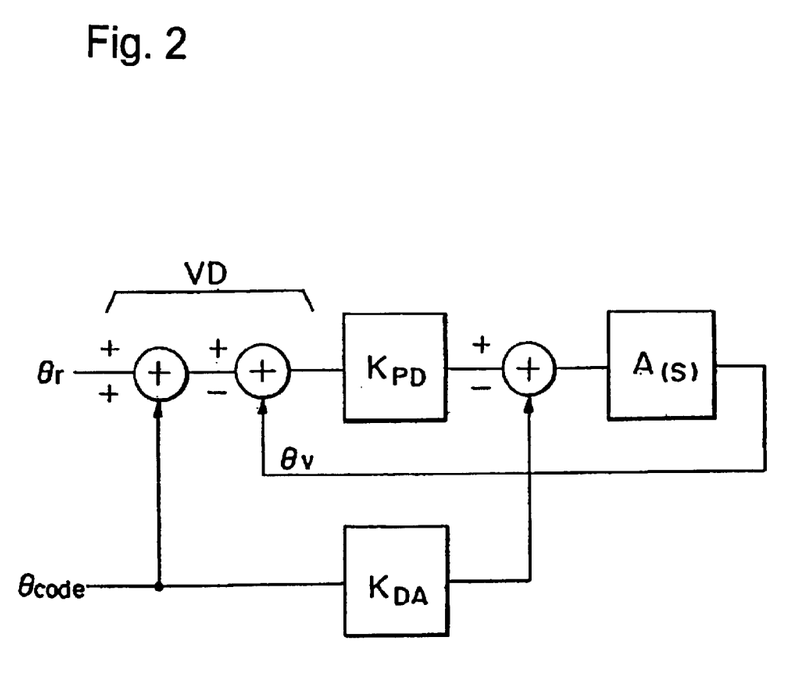
FIG. 2 is a schematic diagram showing a negative feedback loop in the timing signal generation circuit according to Embodiment 1.

FIG. 2 is a schematic diagram showing the negative feedback loop in the timing signal generation circuit according to the embodiment.

In FIG. 2, "VD" represents the variable delay circuit, "$K_{PD}$" represents the phase difference detector, "A(s)" represents the loop filter, and "$K_{DA}$" represents the cancel unit. Further, "θr" represents an input clock signal, "θcode" represents a delay code, and "θv" represents a voltage signal to be fed back to the variable delay circuit.

There is the relationship therebetween represented by the following formula (1).

$$(\theta r - \theta v + \theta code) K_{PD} A(s) - \theta code\, K_{DA} A(s) = \theta v \quad (1)$$

If $K_{PD}$ is equal to $K_{DA}$ for canceling a detection signal of the phase difference detector due to on-the-fly by a reverse detection signal of the cancel unit, the following formula (2) can be obtained.

$$(\theta r - \theta v) K_{PD} A(s) = \theta v \quad (2)$$

The formula (2) is changed to the following formula (3).

$$(\theta v / \theta r) = (K_{PD} A(s))/(1 + K_{PD} A(s)) \quad (3)$$

As shown in the formula (3), the negative feedback loop can maintain the phase lock regardless of the changes in the delay code.

Next, with reference to FIG. 3, the operation of the timing signal generation circuit according to the embodiment will be explained. Specifically, the on-the-fly changes of delay amounts where a delay code is sequentially changed from "0" to "1", "2", and then "3" in a real time operation will be explained.

Figure 3:
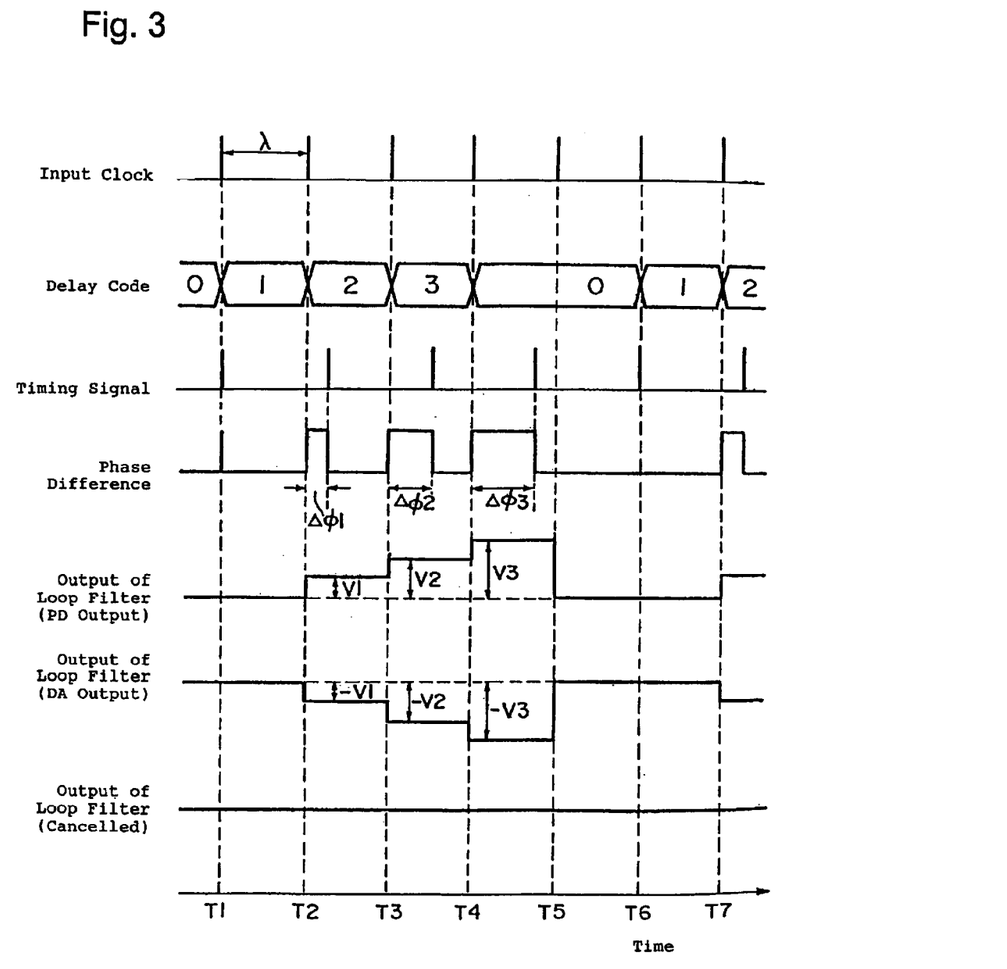
FIG. 3 is a timing chart showing the operation of the timing signal generation circuit according to Embodiment 1.

FIG. 3 is a timing chart illustrating an operation example of the timing signal generation circuit according to the embodiment. In the example shown in FIG. 3, the counter 10 generates input clock signals of a period λ based on the basic clock signals. If the delay code is "0", the variable delay circuit 20 outputs a timing signal in synchronism with an input clock signal.

When a delay code becomes "1", the variable delay circuit 20 outputs a timing signal delayed against an input clock signal by a phase difference Δφ1. The phase difference detector 30 then detects the phase difference Δφ1 and outputs the resultant detection signal. The loop filter 40 smoothes the detection signal to produce a voltage signal v1 in time T2 to time T3.

If this voltage signal v1 is fed back to the variable delay circuit 20 as it is, this is an excessive feedback. As a result, although there is actually no delay deviation of the variable delay circuit due to disturbances and the like, a delay amount of the variable delay circuit is undesirably changed. Accordingly, the phase lock may be released (i.e., the phase lock state may be broken), leading to the occurrence of an error in a timing signal.

In order to prevent such an error, according to the embodiment, the D/A converter of the cancel unit 50 generates a reverse detection signal based on a delay code "1". This reverse detection signal is smoothed to be a voltage signal −v1 in T2 to T3 as shown in FIG. 3. The reverse detection signal and the detection signal are combined to be output to the loop filter 40.

This means the cancellation of the voltage signal v1 obtained by smoothing the detection signal detecting on-the-fly (a PD output of loop filter outputs in FIG. 3) by the voltage signal −v1 of the reverse detection signal (a DA output of loop filter outputs in FIG. 3). As a result, as shown in FIG. 3, an output from the loop filter after the cancellation does not contain changes in voltage signal value due to on-the-fly.

Next, when a delay code becomes "2", the variable delay circuit 20 outputs a timing signal delayed against an input clock signal by a phase difference Δφ2. The phase difference detector 30 then detects the phase difference Δφ2 and outputs the resultant detection signal. The loop filter 40 smoothes the detection signal to produce a voltage signal v2 in time T3 to time T4.

If this voltage signal v2 is fed back to the variable delay circuit 20 as it is, this is an excessive feedback. As a result, like the case where a delay code is "1", although there is actually no delay deviation of the variable delay circuit due to disturbances and the like, a delay amount of the variable delay circuit is undesirably changed. Accordingly, the phase lock may be released, leading to the occurrence of an error in a timing signal.

In order to prevent such an error, according to the embodiment, like the case where a delay code is "1", the D/A converter of the cancel unit 50 generates a reverse detection signal based on a delay code "2". This reverse detection signal is smoothed to be a voltage signal −v2 in T3 to T4 as shown in FIG. 3. The reverse detection signal and the detection signal are combined to be output to the loop filter 40.

This means the cancellation of the voltage signal v2 obtained by smoothing the detection signal detecting on-the-fly due to the change of a delay code to "2" (a PD output of loop filter outputs in FIG. 3) by the voltage signal −v2 of the reverse detection signal (a DA output of loop filter outputs in FIG. 3). As a result, as shown in FIG. 3, an output from the loop filter after the cancellation does not contain changes in voltage signal value due to on-the-fly.

Next, when a delay code becomes "3", a timing signal delayed against an input clock signal by a phase difference Δφ3 is output. The detection signal is smoothed to a voltage signal v3 in time T4 to time T5. The cancel unit 50 generates a reverse detection signal based on a delay code "3", which reverse detection signal corresponds to a voltage signal −v3 in T4 to T5.

The loop filter receives the detection signal combined with the reverse detection signal, thereby generating an output where the voltage signal v3 of the detection signal detecting on-the-fly (a PD output of loop filter outputs in FIG. 3) is cancelled by the voltage signal −v3 of the reverse detection signal (a DA output of loop filter outputs in FIG. 3). Thus, as shown in FIG. 3, an output from the loop filter after the cancellation does not contain changes in voltage signal value due to on-the-fly.

As stated above, in the timing signal generation circuit of the embodiment, the cancel unit 50 generates a reverse detection signal for canceling a detection signal due to on-the-fly, while the negative feedback loop 1 prevents the occurrence of a timing error caused by disturbances and the like. As a result, even if a delay amount is changed in operation, the phase lock is not released and no timing error is therefore occurred. Thus, highly accurate timing signals can be stably generated.

Further, this timing signal generation circuit can be used to constitute a semiconductor test device. A semiconductor test device (IC tester) produces timing waveforms for the application of test patterns to a semiconductor integrated circuit. The timing waveforms are obtained by combining pattern signals generated by a test pattern generator with timing signals generated by a timing signal generation circuit. Thus, if the timing signal generation circuit of the embodiment is used in a semiconductor test device, the semiconductor test device can perform test with an enhanced reliability, since timing signals can be stably generated with high resolution and accuracy.

[Embodiment 2]

A second embodiment of the timing signal generation circuit according to the present invention will be explained with reference to FIG. 4.

In Embodiment 2, like reference numerals denote corresponding constituent elements of Embodiment 1 and detail explanation therefor is omitted.

Figure 4:
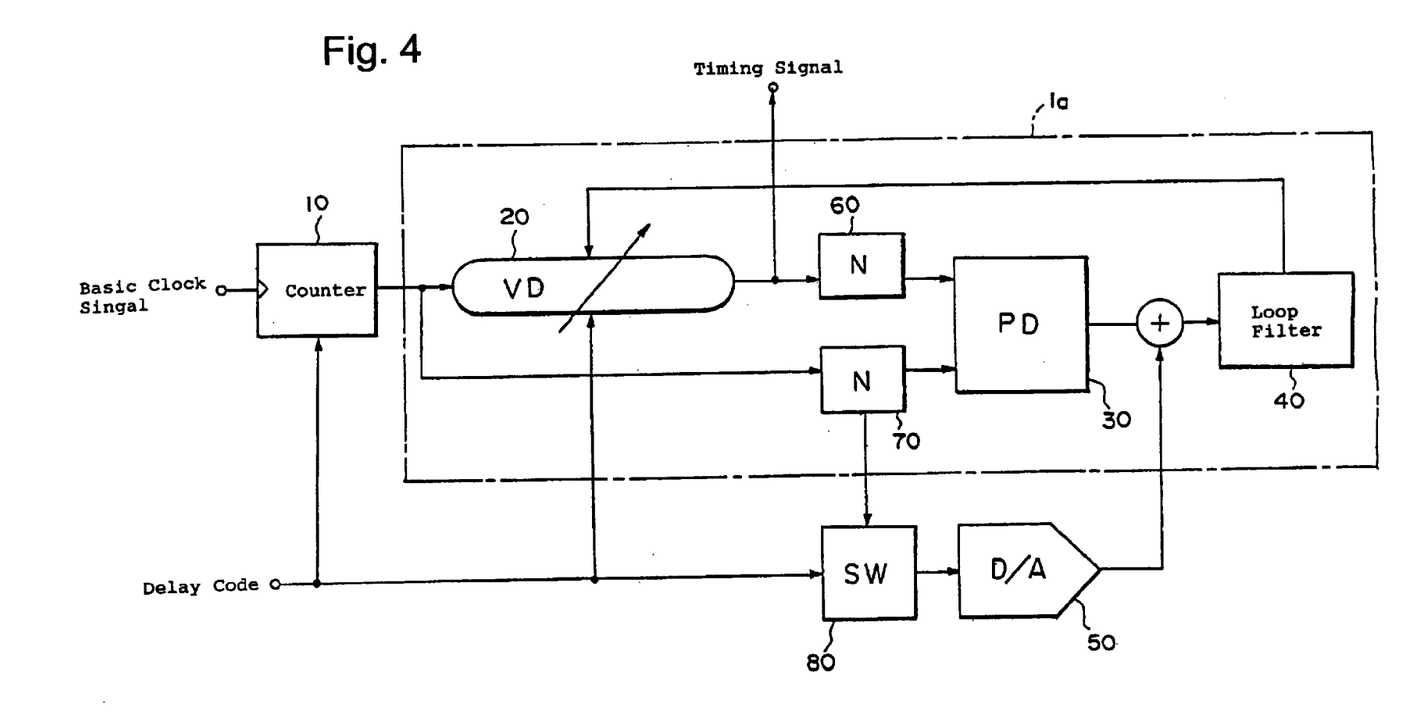
FIG. 4 is a block circuit diagram showing the structure of a timing signal generation circuit according to Embodiment 2.

FIG. 4 is a block circuit diagram showing the structure of a timing signal generation circuit according to Embodiment 2. As shown in FIG. 4, in the timing signal generation circuit of Embodiment 2, a first frequency divider 60 and a second frequency divider 70 are provided in a negative feedback loop 1a. The first frequency divider 60 divides timing signals by "N" (N is an integer of 2 or more) and the divided signals are then input to a phase difference detector 30. The second frequency divider 70 divides input clock signals by "N" and the divided signals are then input to the phase difference detector 30.

The phase difference detector 30 receives input clock signals and timing signals of low frequencies which are each divided by "N". As a result, the operation frequency range required for the phase difference detector 30 can be lower than that of the embodiment in FIG. 1, and, thereby, an inexpensive phase difference detector with lower frequency range can be used as the phase difference detector 30.

In the case where the first and second frequency dividers 60, 70 are provided, a detection signal from the phase difference detector 30 corresponds to a phase difference between both divided signals. Thus, a reverse detection signal for canceling a part of the detection signal caused by on-the-fly is required to be correspondingly divided.

For this purpose, in Embodiment 2, there is provided a switching unit 80 for inputting a delay code by every divided-by-N frequency to the cancel unit 50. The switching unit 80 can be easily constructed, for example, by providing AND gates (not shown), one for each bit of a delay code, such that each AND gate receives a bit of a delay code and an output of the second frequency divider 70. By transmitting outputs of the AND gates to the cancel unit 50, the cancel unit 50 can operate correspondingly to the above frequency division.

[Embodiment 3]

A third embodiment of the timing signal generation circuit according to the present invention will be explained with reference to FIG. 5.

In Embodiment 3, like reference numerals denote corresponding constituent elements of Embodiment 1 and detailed explanation therefor is omitted.

Figure 5:
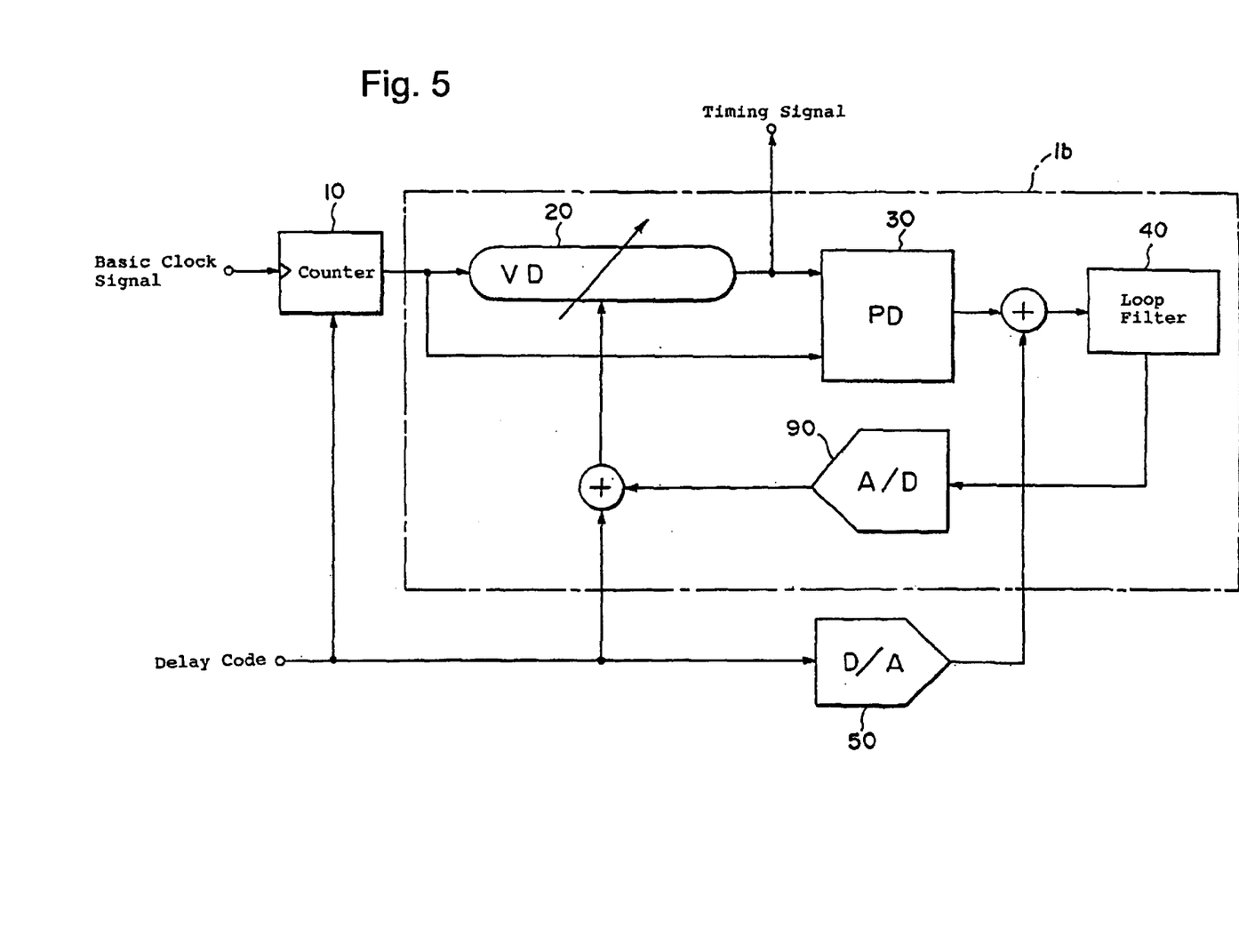
FIG. 5 is a block circuit diagram showing the structure of a timing signal generation circuit according to Embodiment 3.

FIG. 5 is a block circuit diagram showing the structure of a timing signal generation circuit according to Embodiment 3. As shown in FIG. 5, in the timing signal generation circuit of Embodiment 3, an output of the a loop filter 40 is combined with a delay code and then fed back to a variable delay circuit 20.

As stated above, in Embodiment 3, since a voltage signal of a negative feedback loop 1b is fed back to the variable delay circuit with a delay code combined therewith, a delay code can contain a feedback component. By using the combined delay code, feedback can be performed to maintain the phase lock.

Here, a voltage signal output from the loop filter 40 is an analog signal, while a delay code is a digital signal. Thus, according to Embodiment 3, in the negative feedback loop 1b, a voltage signal output from the loop filter 40 is input to an A/D converter 90 and converted to a digital signal by the A/D converter 90. Thereafter, the digital voltage signal is combined with a delay code.

Although the present invention has been explained by using examples of particular constructions in the above embodiments, various changes, modifications and improvements can be made. For example, although the variable delay circuit 20 is of construction similar to that of the first conventional example in the above embodiments, it is not limited thereto.

Further, although a detection signal is combined with a reverse detection signal before it is input to the loop filter in the above embodiments, a detection signal may be combined with a reverse detection signal after it is input to the loop filter.

Further, similar to the case of Embodiment 1, the timing signal generation circuits of Embodiments 2 and 3 are suitable for a semiconductor test device.

This application is based on Japanese Patent Application No. 2000-271734, which is hereby incorporated by reference.

It is to be understood by those skilled in the art that the forgoing description relates to preferred embodiments of the invention and that various changes and modifications may be made in the invention without departing from the spirit and scope thereof. Also it is to be understood that the invention is not limited to the embodiments thereof except as defined in the appended claims.

What is claimed is:

1. A timing signal generation circuit comprising:
    a negative feedback loop for maintaining a phase lock state; the negative feedback loop comprising;
        a variable delay circuit for outputting a timing signal delayed against an input clock signal by a delay amount designated by a delay code;
        a phase difference detector for detecting a phase difference between the timing signal and the input clock signal to output a detection signal; and
        a loop filter for smoothing a waveform of the detection signal to generate a voltage signal and feed the voltage signal back to the variable delay circuit:
    and a cancel unit for generating a reverse detection signal based on the delay code to cancel the phase difference caused by a change in delay amount;
    wherein said reverse detection signal is applied to the loop filter.

2. The timing signal generation circuit according to claim 1, wherein the detection signal is combined with the reverse detection signal and thereafter input to the loop filter.

3. The timing signal generation circuit according to claim 1, wherein the cancel unit comprises a digital/analog converter.

4. The timing signal generation circuit according to claim 1, further comprising:
    a first frequency divider for dividing the timing signal to be input to the phase difference detector by "N" wherein N is an integer of 2 or more:
    a second frequency divider for dividing the input clock signal to be input to the phase difference detector by "N"; and
    a switching unit for inputting the delay code to the cancel unit by every divided-by-N frequency.

5. The timing signal generation circuit according to claim 1, wherein the negative feedback loop further comprises an analog/digital converter for converting the voltage signal received from the loop filter from an analog signal to a digital signal, and an output of the analog/digital converter is combined with the delay code and thereafter fed back to the variable delay circuit.

6. A semiconductor test device comprising:
    the timing signal generation circuit of claim 1, for generating a timing signal: and
    a test pattern generator for generating a pattern signal, the pattern signal being combined with the timing signal to generate a timing waveform for test of a semiconductor integrated circuit.

* * * * *